United States Patent [19]
Phillips

[11] 4,336,917
[45] Jun. 29, 1982

[54] SHOCK AND VIBRATION ISOLATION SYSTEM

[75] Inventor: Edward H. Phillips, Mountain View, Calif.

[73] Assignee: Optimetrix Corporation, Mountain Viwew, Calif.

[21] Appl. No.: 83,769

[22] Filed: Oct. 11, 1979

[51] Int. Cl.³ .......................................... F16M 13/00
[52] U.S. Cl. .................................. 248/550; 248/562; 248/636
[58] Field of Search ............... 248/562, 566, 550, 636, 248/638, 631; 188/1 B

[56] References Cited

U.S. PATENT DOCUMENTS

| | | | |
|---|---|---|---|
| 2,956,761 | 10/1960 | Weber | 248/550 |
| 3,189,303 | 6/1965 | Boothe | 248/550 |
| 3,281,101 | 10/1966 | May | 248/550 |
| 3,282,542 | 11/1966 | Goodwin et al. | 248/550 |
| 3,598,353 | 8/1971 | De Grex | 248/631 |
| 3,606,233 | 9/1971 | Scharton | 248/550 |
| 3,703,999 | 11/1972 | Forys | 188/1 B X |
| 3,807,678 | 4/1974 | Karnopp | 188/1 B X |
| 3,917,201 | 11/1975 | Roll | 248/631 X |
| 4,033,541 | 7/1977 | Malueg | 188/1 B X |
| 4,147,319 | 4/1979 | Tsybulnik | 248/631 X |
| 4,198,159 | 4/1980 | Cachon | 355/55 |
| 4,218,136 | 8/1980 | Komoriya et al. | 355/79 |

FOREIGN PATENT DOCUMENTS

| | | |
|---|---|---|
| 2642522 | 3/1978 | Fed. Rep. of Germany . |
| 1190712 | 10/1959 | France . |
| 2238870 | 2/1975 | France . |
| 917521 | 2/1963 | United Kingdom . |
| 1064671 | 4/1967 | United Kingdom . |
| 1324810 | 7/1973 | United Kingdom . |
| 1400389 | 7/1975 | United Kingdom . |
| 540081 | 2/1977 | U.S.S.R. .............................. 188/1 B |
| 557221 | 6/1977 | U.S.S.R. .............................. 188/1 B |
| 596763 | 3/1978 | U.S.S.R. .............................. 248/550 |
| 652392 | 3/1979 | U.S.S.R. .............................. 188/1 B |
| 653146 | 3/1979 | U.S.S.R. .............................. 188/1 B |

Primary Examiner—J. Franklin Foss
Attorney, Agent, or Firm—Patrick J. Barrett; Roland I. Griffin

[57] ABSTRACT

A shock and vibration isolation system having a plurality of isolators supporting a utilization device is disclosed. Each isolator has two gas driven pistons, pivotally mounted in a frame and is connected to an accumulator/controller that supplies controlled amounts of pressurized gas. A sensor in each isolator senses the position of the utilization device with respect to a base sitting on the ground, and the accumulator/controller adds gas to or exhausts gas from the pistons to counteract changes in position detected by the sensor. An electronic control circuit is connected between the sensor and the accumulator/controller to supply a properly compensated signal from the sensor to control the accumulator/controller.

24 Claims, 16 Drawing Figures

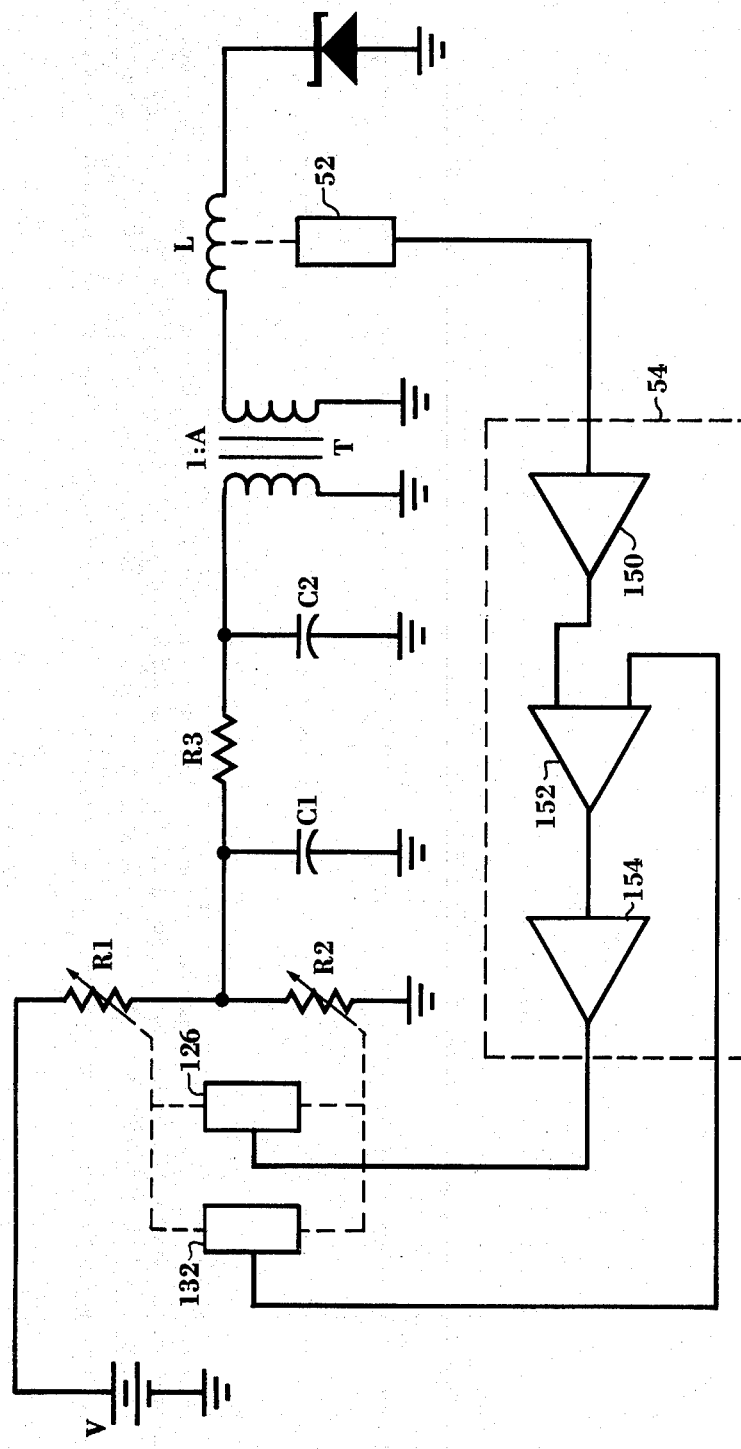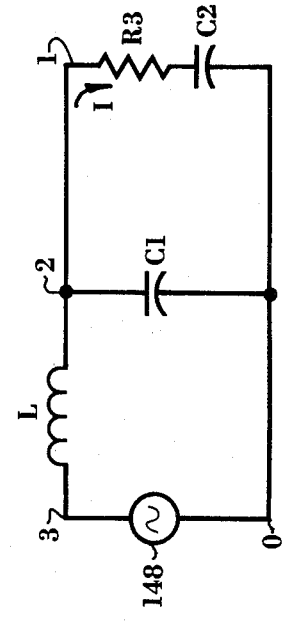
FIGURE 12A
FIGURE 12B

SHOCK AND VIBRATION ISOLATION SYSTEM

BACKGROUND OF THE INVENTION

The present invention relates to shock and vibration isolators used to support high precision or delicate equipment. Many precision optical instruments such as, for example, photograph mask aligners used in the production of semiconductor devices are adversely affected by shocks and vibrations transmitted through the floor or the work surface on which they sit.

Various types of vibration damping devices, such as rubber pads or feet are helpful, but some instrument systems require greater isolation than can be provided by such passive devices. Gas filled shock absorbers are frequently used for instrument systems that are heavy and require high isolation. Prior art gas-filled shock absorbers were usually one of two types. One type was essentially a gas-filled rubber bag with a mechanically controlled valve. The valve was coupled to the supported device so that gas would be added to or exhausted from the bag in response to relative movement between ground and the supported device. One of the major disadvantages of gas-filled rubber bags is their large size. Another disadvantage is the limited feedback characteristics of the mechanically controlled valve. It is sometimes difficult to make a system with these valves stable and it is difficult to compensate such a system to improve its stability. In addition, a gas-filled air bag does not work well with utilization devices that are relatively tall and narrow and thus have a relatively high center of gravity.

A second type of prior art shock absorber is an air piston that is constructed using a commercially available sealing device known as a rolling Bellowfram. This piston fits loosely in an air cylinder and the piston to cylinder seal is effected by the Bellowfram which is essentially a flexible diaphragm. The piston can move along the vertical axis by the additon or removal of gas, as with the rubber bag. Because of the rolling action of the Bellowfram and the compressibility of the gas, this device has a relatively high compliance along the vertical axis to isolate against shocks along that axis. However, the compliance of this device is lower in the horizontal plane than along the vertical axis whereas the rubber bag can be made to have equal compliance along all three axes. Thus, the air piston using a Bellowfram does not isolate against shocks in the horizontal plane as well as the rubber bags do. Air pistons using Bellowframs were also controlled by a mechanically actuated valve and thus have had the response and stability disadvantages that were described above.

SUMMARY OF THE INVENTION

In accordance with a preferred embodiment of the present invention a shock and vibration isolation system supports a utilization device on a member or platform that is attached to a number of isolation devices. These isolation devices are, in turn, attached to a base which rests on the floor or support surface where the utilization device is located.

Each isolation device is essentially a frame with two air driven pistons mounted on diaphragms so that they can swivel about two axes orthogonal to their axis of displacement. One air piston is attached to the base and the other is attached to the platform supporting the utilization device. The two air pistons in an isolation device are connected to an accumulator/controller which supplies pressurized air to the pistons in such a manner as to keep the relative distance between the two air-pistons the same and thus to cancel any relative movement between them.

Each accumulator/controller has an air accumulator with a control valve that controls an inlet and an outlet port. The valve is connected to an electronic control circuit which causes the valve to admit pressurized air into the accumulator or exhaust air from the accumulator in response to a signal from a sensor that measures the relative distance between the two air cylinders. As the distance between the two air cylinders in an isolation device starts to increase in response to a shock transmitted to the base, the control valve admits more air into the accumulator and this air is supplied to the air cylinders to urge them closer together. Conversely, if the air cylinders in an isolation device start to move towards each other, the control valve will exhaust some air from the accumulator.

In the preferred embodiment, the accumulator actually comprises two accumulator chambers coupled by a flow restrictor designed to provide damping at the resonant frequency of the system. The two accumulators and the flow restrictor form a low pass filter to filter out any pertubations in air pressure caused by the control valve.

Shocks and vibrations along the vertical axis are counteracted directly by the action described above; those in the horizontal plane are counteracted by a combination of factors. Because of the way the air pistons are mounted in the frame of each isolation device, each isolation device, together with the mass it supports, acts like a Foucault pendulum. Thus the restoring force for pertubations in the horizontal plane is gravity and damping for horizontal motions is provided by crosscoupling to the vertical axis through the isolation device frame, as well as by energy loss in the diaphragms on which the pistons are mounted.

Since the accumulator is physically separate from the isolator, the isolator can be made much more compact than the prior art devices which included an accumulator right in the shock absorber itself. Vertical position control in the preferred embodiment of applicants' invention is provided through an optoelectronic sensor and some electronic control circuitry that allows the provision of compensation to ensure system stability. Applicants' accumulator/controller, together with the electronic control circuitry, allow the support and isolation of tall, narrow utilization devices that are difficult or impossible to support and isolate properly on prior art devices.

Compensation provided in the electronic control circuit in accordance with the preferred embodiment of the present invention avoids the closed loop stability problems of prior art devices. A separate position servo feedback control loop within the main feedback loop is provided for the valve that admits gas to or exhausts gas from the accumulator/controller. By so doing, the influence of the characteristics of the valve in the accumulator/controller is minimized and the mass-air system can be compensated for stability essentially independently of the valve.

BRIEF DESCRIPTION OF THE DRAWINGS

FIGS. 12 and 12B show a schematic block diagram of electronic control circuitry and equivalent electrical circuits representing an accumulator/controller.

DETAILED DESCRIPTION OF THE PREFERRED EMBODIMENT

Figure 1:
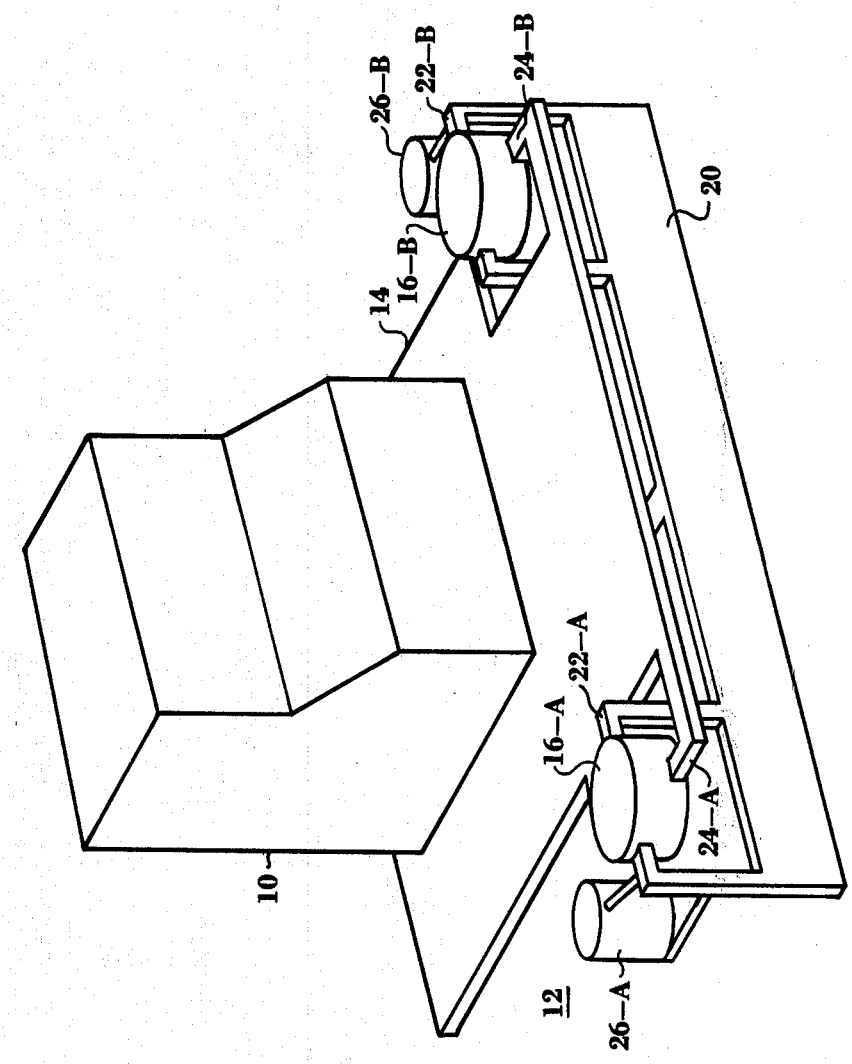
FIG. 1 shows a perspective view of a utilization device supported on a shock and vibration isolation system in accordance with the preferred embodiment of the present invention.
Figure 2:
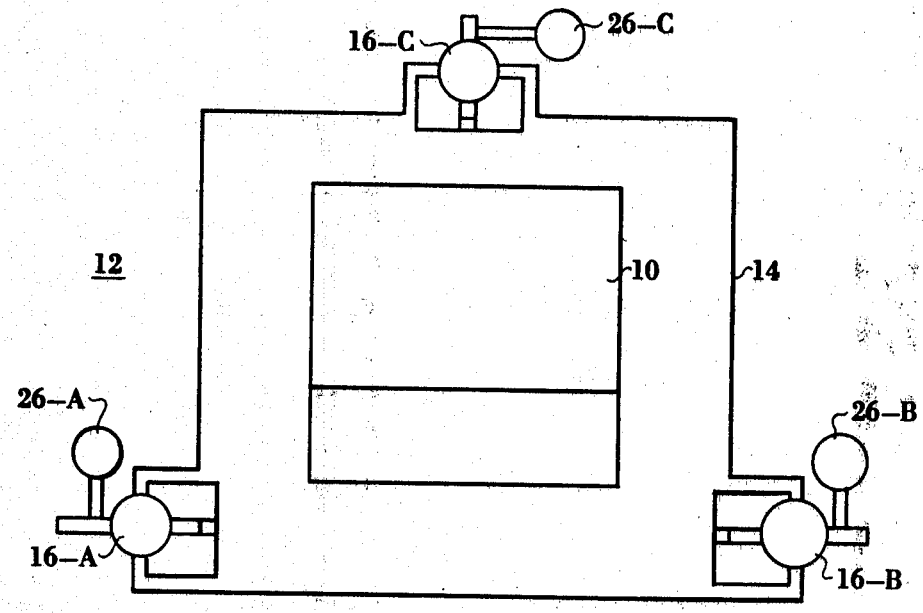
FIG. 2 shows a plan view of FIG. 1.

FIGS. 1 and 2 show a diagrammatic representation of a utilization device 10 supported by a shock and vibration isolation system 12. The isolation system has a support member or platform 14 that supports utilization device 10 and which is attached at 3 points to three isolators 16-A, 16-B and 16-C. The isolators are attached, in turn, to a base 20 which rests on the floor or other appropriate support surface.

Figure 3:
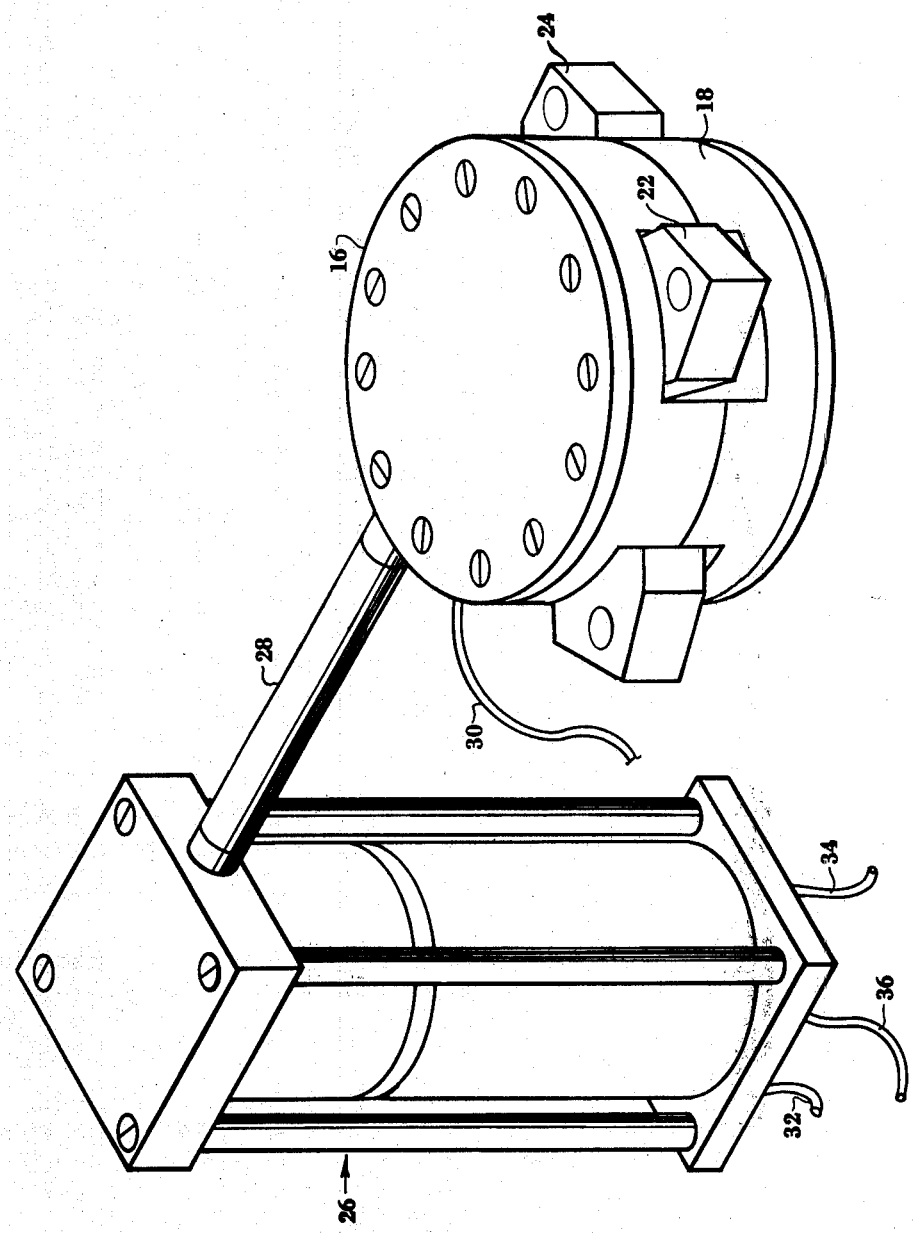
FIG. 3 shows a perspective view of an isolator in accordance with the preferred embodiment of the present invention.
Figure 4:
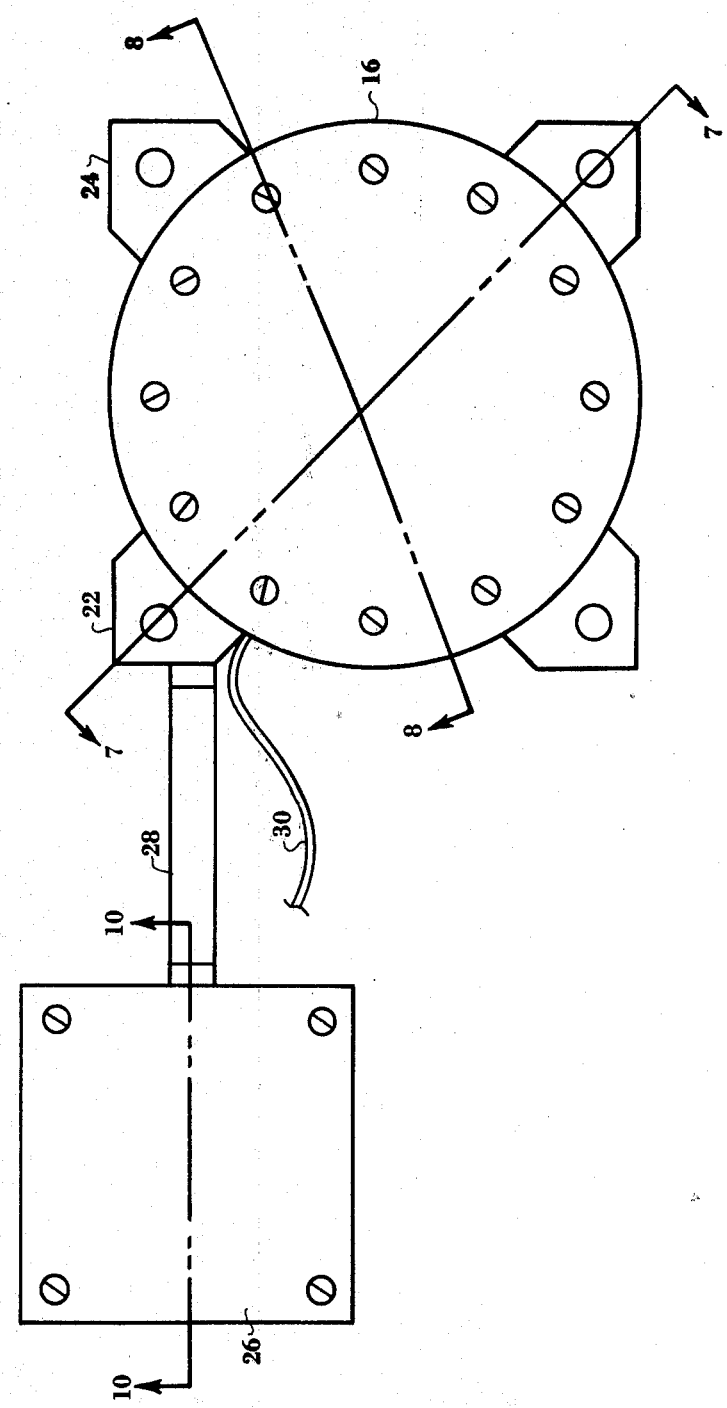
FIG. 4 shows a plan view of the device of FIG. 3.

An isolator 16 is shown in greater detail in FIGS. 3 and 4 where it can be seen that each isolator has a frame 18 in which are supported two mounting members 22 and 24. Mounting member 22 is attached to base 20 and mounting member 24 is attached to platform 14 via the mounting holes provided in the mounting members. Each isolator is connected to an accumulator/controller 26 by a tube 28. Each accumulator/controller is connected to a source of pressurized gas (not shown) such as air by an inlet tube 32 and can exhaust gas via an outlet tube 34. Electronic control circuitry (see FIGS. 12A, 13A and 13B) is connected to the accumulator/controller by a cable 36 and to the isolator by a cable 30.

Figure 5A:
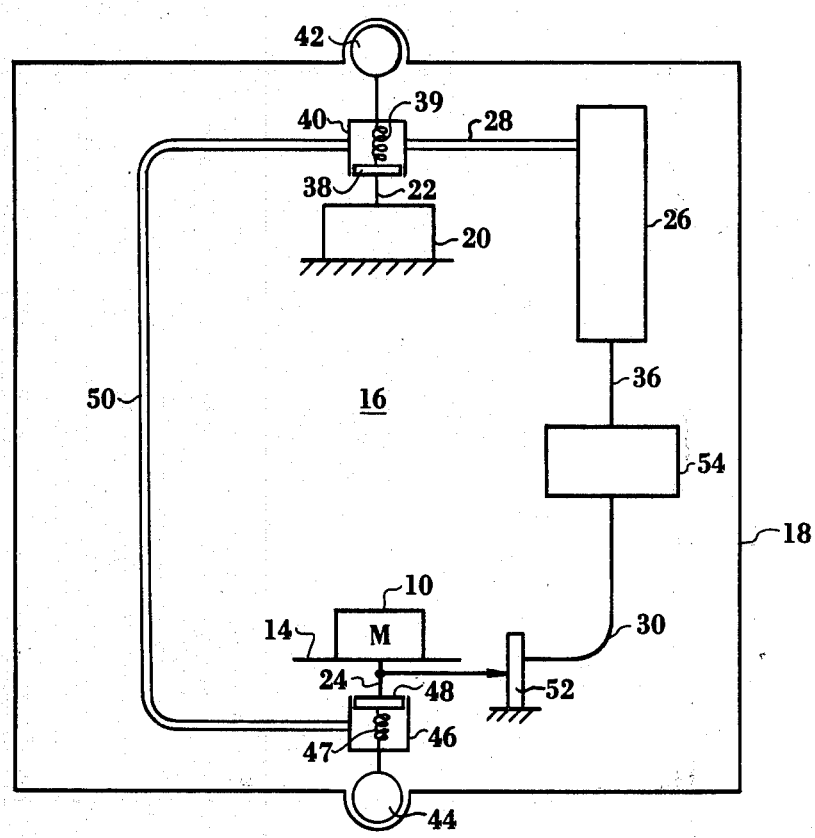
FIGS. 5A, 5B and 6 show schematic representations of an isolator and its operation.
Figure 5B:
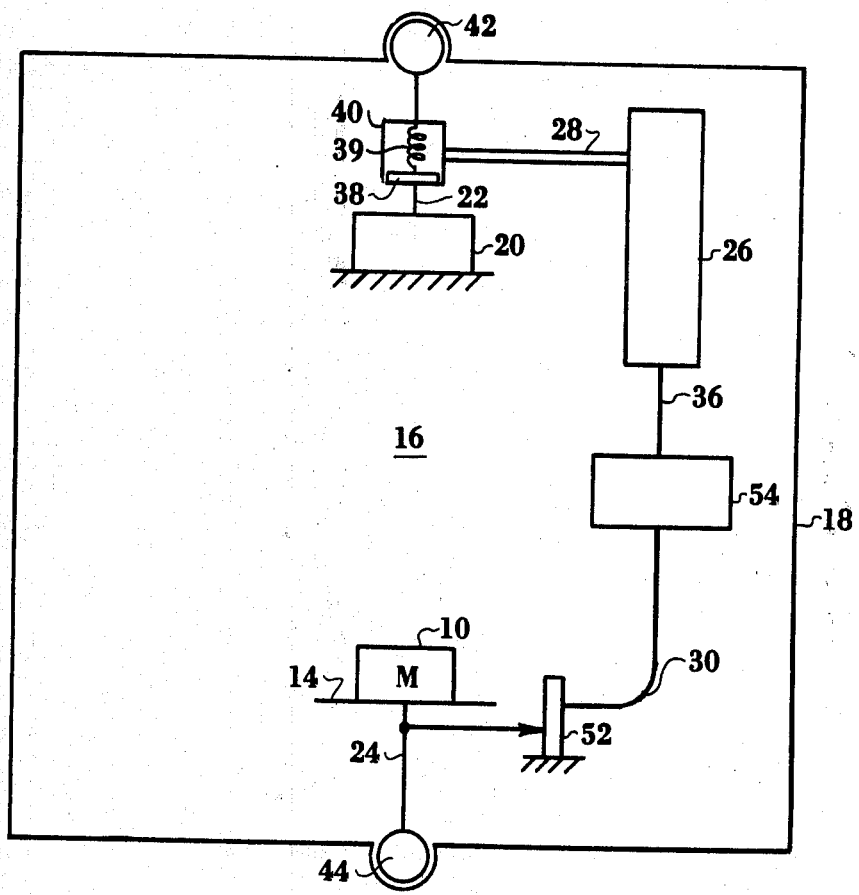
Figure 6:
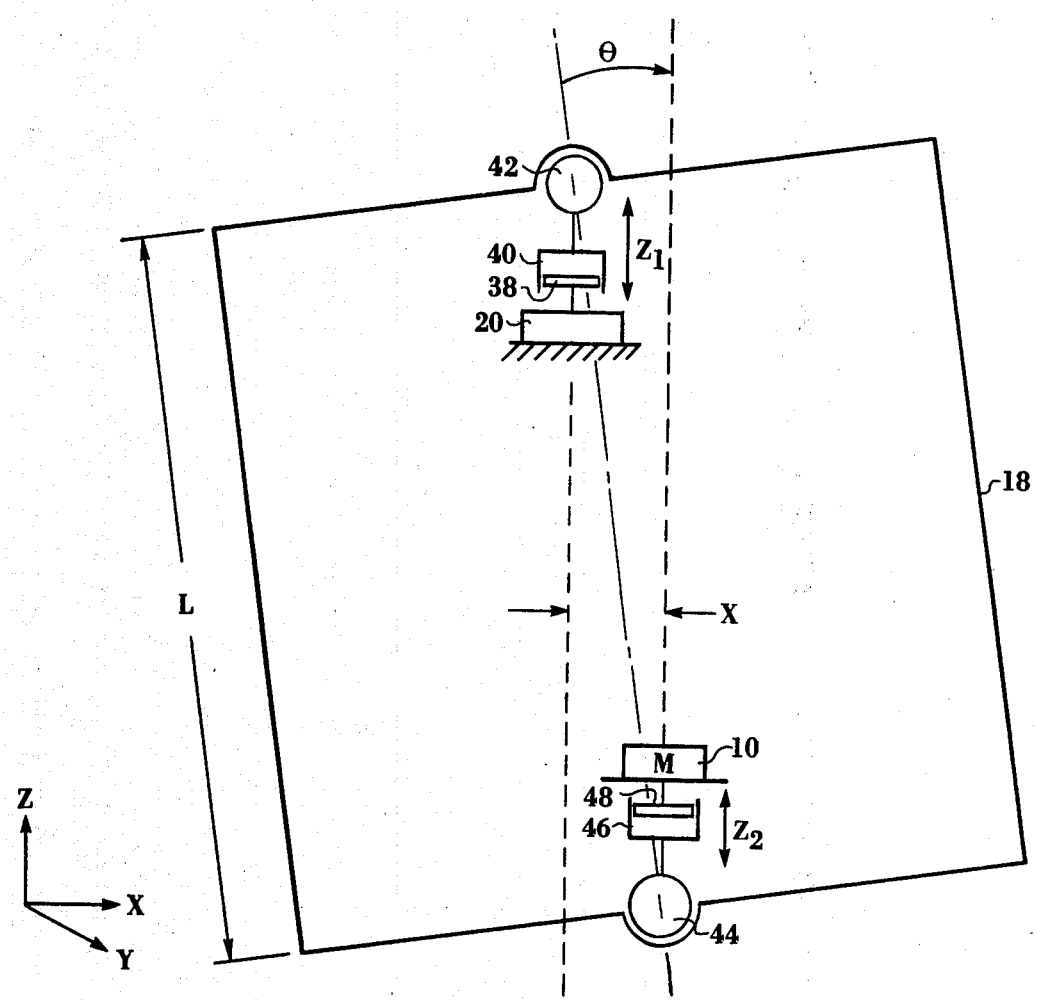

FIGS. 5A, 5B and 6 show a schematic representation of isolator 16 and illustrate the manner in which it functions. Although the same reference numerals have been used for the elements in the schematic diagrams and in the other figures, it will be understood that the schematic diagram is intended to be an idealized representation of the various elements and does not necessarily represent the exact physical form of those elements in the preferred embodiment.

Support member 22 is connected to the ground and will be considered the source of all unwanted disturbances for the purpose of this discussion. A piston 38 in air cylinder 40 is connected to support member 22, and air cylinder 40 is connected to frame 18 by a ball joint 42. A second ball joint 44 is connected to a second air cylinder 46 which has a piston 48 connected to platform 14 by support member 24. Utilization device 10 is represented as a mass M on platform 14. Pressurized air is supplied to the air cylinders through tube 28 and air interconnecting passage way 50. In order to balance out the weight of frame 18 and nominally center pistons 38 and 48 within air cylinders 40 and 46, springs 39 and 47 are provided. They are shown, for the sake of illustration, as being within the air cylinders, but they could of course be placed elsewhere in the structure to perform the same function.

A position sensor 52 is attached to support member 24 and referenced to support member 22 to indicate the relative distance between the two support members as well as any change in that relative distance. Sensor 52 is connected to electronic control circuit 54 by cable 30 and accumulator/controller 26 is connected thereto by cable 36.

FIG. 6 gives an exaggerated illustration of the effects of a shock causing a displacement between base 20 and utilization device 10 in its quiescent position. Some of the elements shown in FIG. 5 have been omitted in this illustration for the sake of clarity. If a shock causes a displacement in the horizontal plane along the X-axis, frame 18 will pivot about ball joints 42 and 44 by an amount $\theta$. If the ball joints are separated by an amount L, it can be seen that the X-axis displacement can be expressed as:

$$x = L \sin \theta.$$

Likewise, if there is a displacement along the Y-axis and frame 18 rotates by an amount $\phi$, then the displacement can be expressed as:

$$y = L \sin \phi.$$

It can readily be seen that these two expressions are the equations for a Foucault pendulum, and the restoring force for any perturbations in the horizontal plane is gravity acting on the mass M of utilization device 10.

Any displacement along the vertical or Z-axis will result in compression or expansion of air cylinders 40 and 46 by amounts of $Z_1$, and $Z_2$ respectively. The net displacement will then be:

$$Z = Z_1 + Z_2.$$

Restoration to the neutral position in the Z-axis is achieved by adding or exhausting air by accumulator/controller 26 in response to a signal from position sensor 52. As will be explained below, damping is also provided by accumulator/controller 26. This damping acts directly on the restorative force applied along the Z-axis and indirectly along the X- and Y-axis since there is some cross-coupling motion in the horizontal plane to the vertical axis.

Figure 7:
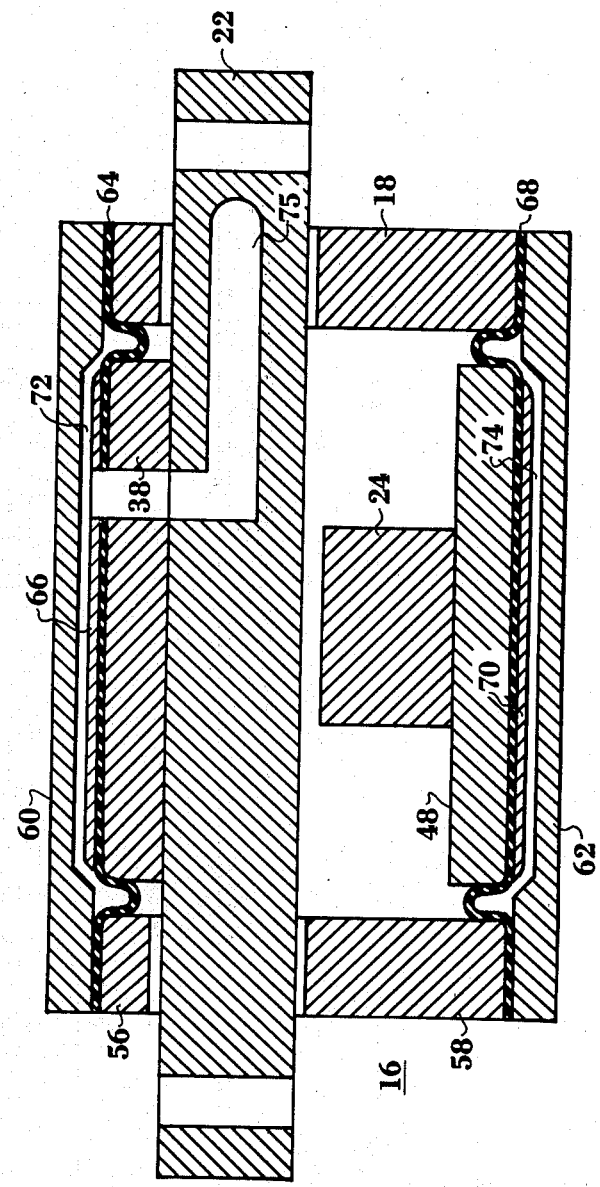
FIGS. 7 and 8 show cross-sectional views of the isolation of FIG. 4.
Figure 8:
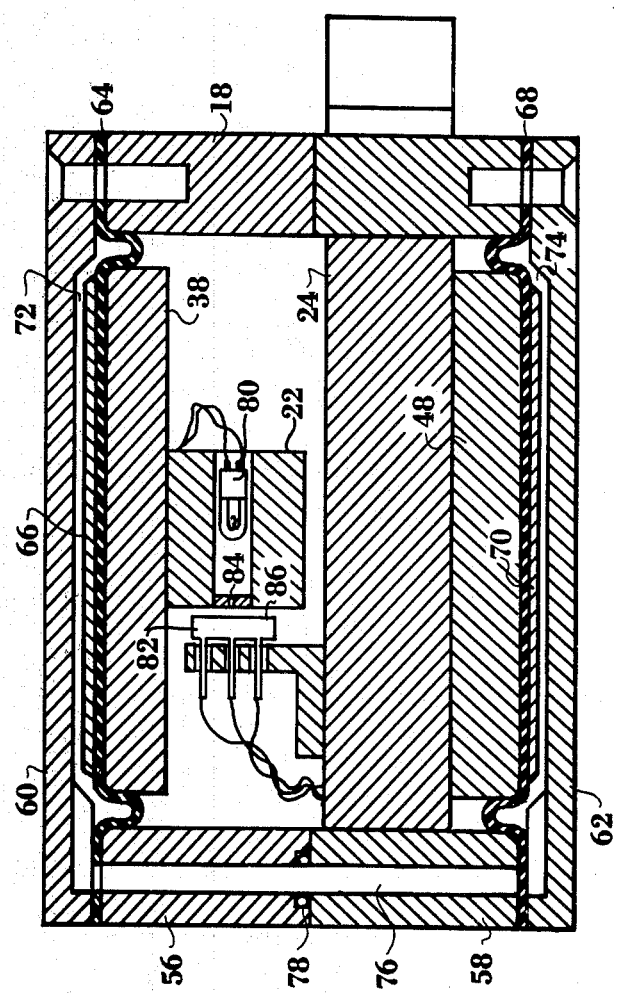
Figure 9:
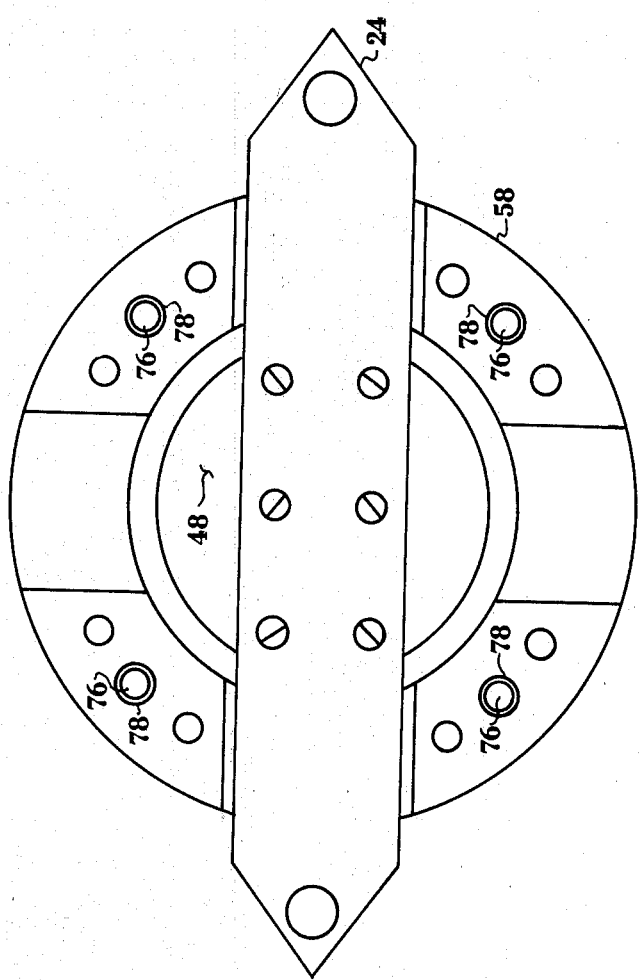
FIG. 9 shows the bottom half of an isolator.

FIGS. 7 and 8 show cross-sectional views of isolator 16, and FIG. 9 shows the bottom half of the isolator after the top half has been removed to reveal the interior portion thereof. Frame 18 comprises an upper frame half 56 and a lower frame half 58 capped by frame caps 60 and 62, respectively. Clamped between cap 60 and upper frame half 56 is a diaphragm 64 which is also attached to piston 38 by piston cap 66. Likewise, clamped between lower frame half 58 and frame cap 62 is a diaphragm 68 that is clamped to piston 48 by a piston cap 70. Piston 38 is attached to support member 22; and piston 48, to support member 24.

As can be seen from FIGS. 7 and 8, there is an air space 72 defined by piston cap 66, diaphragm 64 and frame cap 60 that corresponds to the air space in cylinder 40. In essence, frame cap 60 and diaphragm 64 form the equivalent of piston 38. Diaphragm 64 also provides the pivoting motion of ball joint 42 as well as some of the centering force of spring 39. Similarly, an air space 74, corresponding to the air space in cylinder 46, is formed by piston cap 70, diaphragm 68 and frame cap 62; and the equivalents of ball joint 44, spring 47 and piston 48 are formed by piston cap 70 and diaphragm 68 as above. The diaphragm, which can be made out of cloth reinforced rubber, serves not only as the piston-to-cylinder wall seal and the pivot, but also as a seal between each frame cap and its corresponding frame half. Furthermore, some damping of the pivoting motion is provided by the diaphragms. In order to support the weight of frame 18, piston 38 is made slightly larger than piston 48 so that at the nominal working air pressure, the difference between the piston surface areas times the air pressure equals the weight of frame 18.

Pressurized air is supplied to air space 72 by a passageway 75 in support member 22 which connects to tube 28 at one end of support member 22. The two air spaces 72 and 74 are connected together by several passageways 76 in frame 18. Each passageway is sealed by an "O"-ring 78 where upper frame half 56 meets lower frame half 58.

It should be understood that an isolator could be made with just one piston 38 and air cylinder 40 if support member 24 were connected directly to ball joint 44. Two pistons and air cylinders were used in the preferred embodiment in part because the diaphragms provide the pivoting function as explained above. However, if other means were provided for the pivot, the isolator could be configured as illustrated in FIG. 5B.

Position sensor 52 comprises a light source 80 mounted in support member 22 and a light sensitive detector 82 mounted on support member 24. Light from light source 80 passes through a narrow slit 84 and strikes the sensitive surface 86 of detector 82, and the detector produces a differential electrical signal proportional to the position of the light on sensitive surface 86. In the preferred embodiment, detector 82 is a United Detector Technology Model Pin Spot/2D. Detector 82 has three terminals, and the center terminal is connected to ground (see FIG. 12A). When light strikes sensitive surface 86, a voltage is generated between the center terminal and the two end terminals. The farther apart the two support members are the greater the voltage between the upper terminal and ground. Conversely, the closer the two support members are to each other, the greater the voltage between the lower terminal and ground.

Figure 10:
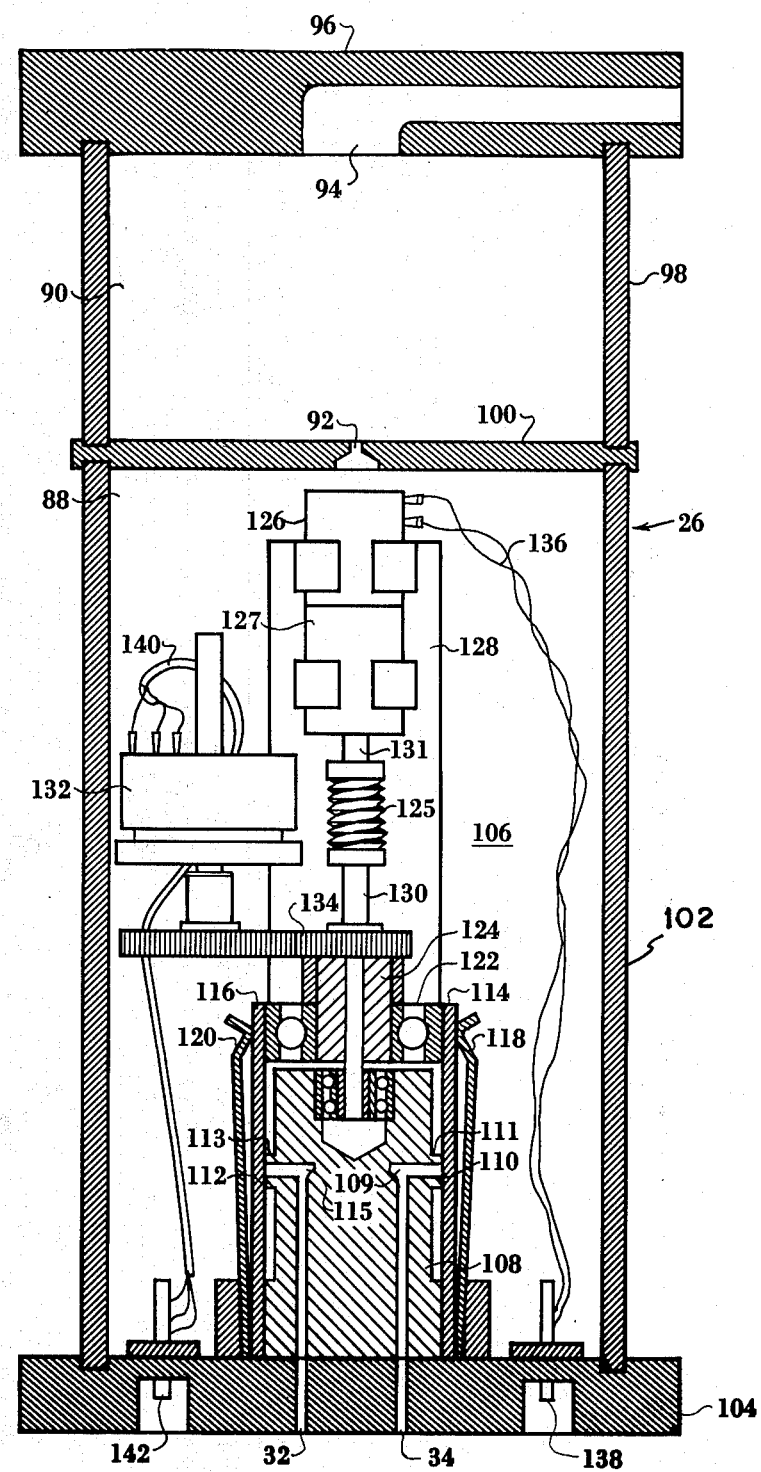
FIG. 10 shows a cross-sectional view of an accumulator/controller.

FIG. 10 shows a cross-sectional view of accumulator/controller 26 which has an accumulator 88 coupled to another accumulator 90 by a flow restrictor 92. Accumulator 90 is formed by a top plate 96, a cylindrical wall 98 and a flow restrictor plate 100, and is coupled to isolator 16 by a passageway 94 in top plate 96 that connects to tube 28. Accumulator 88 is formed by flow restrictor plate 100, a cylindrical wall 102 and a bottom plate 104.

Figure 11:
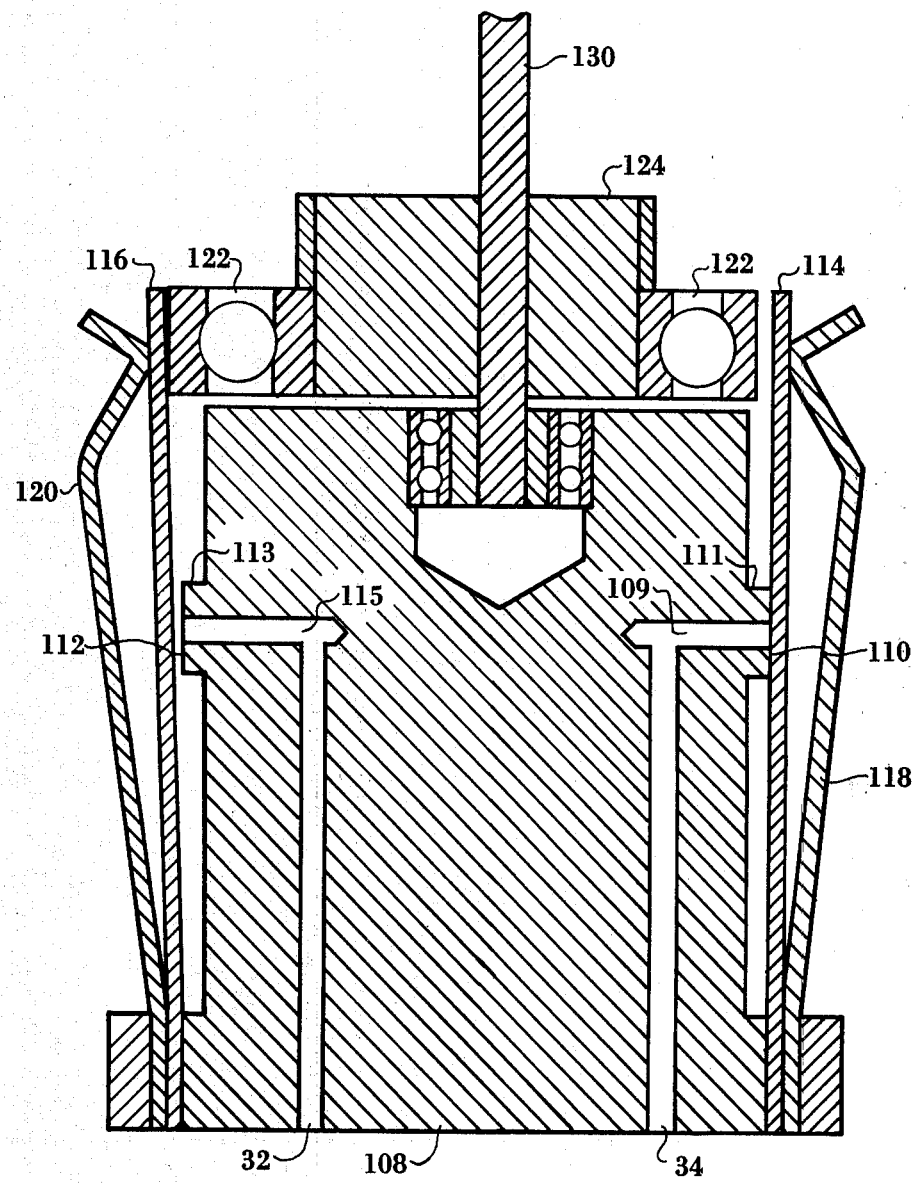
FIG. 11 shows a detailed cross-sectional view of a valve for the accumulator/controller of FIG. 10.

A motor driven valve mechanism 106, a portion of which is shown in greater detail in FIG. 11, is mounted on bottom plate 104 inside accumulator 88. Valve mechanism 106 comprises a valve body 108 that has an inlet tube 32 and an outlet tube 34, each coupled to valves 110 and 112, respectively. Valve 110 comprises a bore 109 surrounded by a boss 111 that forms a valve seat and against which rests an arm 114 that is held against the boss by a cantilever spring 118. The mating surfaces of boss 111 and arm 114 are both lapped so that they form a tight seal when closed. Likewise, valve 112 has a boss 113 with a bore 115 closed by an arm 116 to which force is applied by cantilever spring 120. Arms 114 and 116 also rest against a ball bearing 122 that has an eccentric bushing 124 passing through it. Eccentric busing 124 is mounted on a drive shaft 130 which is coupled to an electric motor 126 by a bellows coupling 125 and a reduction gear box 127. Bellows coupling 125 allows for possible misalignment between drive shaft 130 and a gear box output shaft 131. The motor and gear box are mounted on a support 128 fastened to bottom plate 104.

Also mounted on support 128 is a potentiometer 132 that is coupled to drive shaft 130 by a gear train 134 and provides an electrical indication of the position of the valve. Electrical leads 136 from motor 126 are connected to a feed-through connector 138 and electrical leads 140 from potentiometer 132 are connected to a feed-through connector 142. On the outside of the accumulator/controller cable 36 connects to feed-through connectors 138 and 142.

When motor 126 is energized, it drives gear box 127 which reduces the speed of the motor by a factor of 96 in the preferred embodiment. In response, output shaft 131 rotates eccentric bushing 124 through bellows coupling 125 and drive shaft 130. Since the outside diameter of eccentric bushing 124 is eccentric with respect to the inside diameter, rotation of the bushing will cause ball bearing 122 to shift laterally, displacing either arm 114 or 116, depending on the direction of rotation. For example, if ball bearing 122 shifts to the left as shown in FIG. 11, arm 116 will be forced to the left and away from boss 113, opening the valve and admitting more air into accumulator 88. At the same time, the shaft of potentiometer 132 will be rotated by gear train 134 and the resistance between the center contact and the two end contacts of the potentiometer will change.

Each of the valves 110 and 112 acts as a variable flow restrictor controlled by motor 126. The flow restriction is inversely proportional to the third power of the gap between boss 111 or 113 and the corresponding arm 114 or 116 (the viscous loss) added to the pressure drop divided by the square of the flow rate through bore 109 or 115 (the kinetic loss).

FIG. 12A shows a schematic circuit diagram of an electrical equivalent to accumulator/controller 26 as well as a block schematic diagram of the electronic control circuitry 54. The supported mass of utilization device 10 and platform 14 is represented by an inductor L which is coupled to a transformer T representing air cylinders 40 and 46 together with their pistons 38 and 48. The ratio of the transformer is 1:A where A is the mean surface area of pistons 38 and 48.

Capacitors $C_1$ and $C_2$ represent accumulators 90 and 88, respectively, and a resistor $R_3$ represents flow restrictor 92. Variable resistors $R_1$ and $R_2$ represent valves 112 and 110 which are shown coupled to motor 126 and potentiometer 132. A battery V represents the source of pressurized air to valve 112.

Representing the mechanical elements with equivalent electrical circuit components aids in analysis of system behavior and in selection of appropriate component values in both the mechanical portion of the system and in the electronic control circuit. In the preferred embodiment, the weight of utilization device 10 and platform 14 is approximately 750 lbs., and thus the mass to be supported by each isolator 16 is one-third of the total, i.e., $$M = \frac{250 \text{ lbs.}}{386 \text{ in/sec}^2} = 0.658 \frac{\text{lb. sec}^2}{\text{in}}$$

The mean area of pistons 38 and 48 was chosen to be $A = 6.35$ in$^2$ for a design pressure in air cylinders 40 and 46 of approximately 40 pounds per square inch.

Given the foregoing quantities, the value of L as seen by $C_1$, $R_3$ and $C_2$ through the transformer is:

$$L = 0.658 \frac{\text{lb sec}^2}{\text{in}} \cdot \frac{1}{6.35^2} \text{ in}^4 = 0.0163 \frac{\text{lb sec}^2}{\text{in}^5}$$

The volume of accumulator 90 is 8 in$^3$, and the volume of accumulator 88 is 24 in$^3$, so $C_1$ and $C_2$ have the values of:

$$C_1 = \frac{8 \text{ in}^3}{40 \text{ lb/in}^2} = 0.2 \frac{\text{in}^5}{\text{lb}}$$

$$C_2 = \frac{24 \text{ in}^3}{40 \text{ lb/in}^2} = 0.6 \frac{\text{in}^5}{\text{lb}}$$

For the purposes of analysis of the accumulator/controller, the circuit of FIG. 12A can be simplified to that of FIG. 12B where an A.C. voltage source 148 represents the source of disturbance of a frequency $\omega$ to the mass-air system. The impedance of the inductive and capacitive elements is then:

$$Z_L = j\omega\, 0.0163$$

$$Z_{C_1} = \frac{1}{j\omega\, .2}$$

$$Z_{C_2} = \frac{1}{j\omega\, .6}$$

These values, together with FIG. 12B, will be used to demonstrate the selection of a value for $R_3$ (the resistance of flow restrictor 92) for maximum damping. In the following expressions for the voltages and currents in the circuits, the subscripts indicate the nodes 0, 1, 2 and 3.

$$V_{1-0} = I R_3 + \frac{I}{j\omega\, .6} = I R_3 - \frac{jI}{\omega\, .6}$$

$$I_{2-0} = \left( I R_3 - j\frac{I}{\omega\, .6} \right) j\omega\, .2 = \frac{I}{3} + jIR_3\omega\, .2$$

$$I_{3-2} = \frac{4}{3} I + jIR_3\omega\, .2$$

$$V_{3-2} = \left( \frac{4}{3} I + jIR_3\omega\, .2 \right) j\omega\, .0163$$

$$= -IR_3\, \omega^2\, .00326 + jI\omega\, .0217$$

and $$V_{3-0} = I\left[ R_3(1 - \omega^2\, .00326) + j\left(\omega\, .0217 - \frac{1.667}{\omega}\right) \right]$$

The resonance of the circuit, by definition, is the frequency where $$\frac{I_{3-2}}{V_{3-0}}$$

is a maximum.

$$\frac{I_{3-2}}{V_{3-0}} = \frac{1.333 + jR_3\omega\, .2}{R_3(1 - \omega^2\, .00326) + j\left(\omega\, .0217 - \frac{1.667}{\omega}\right)}.$$

$R_3$ will give maximum damping if it is selected so that $P_R/VA_L$ is a maximum where $P_R$ is the power dissipated in resistor $R_3$ and $VA_L$ is the power in the vibrating mass.

$$\frac{1}{QF} = \frac{P_R}{VA_L} = \frac{I^2 R_3}{I^2 \mid [(1.78 - .04\omega^2 R_3^2) + j(.553\omega R_3)]j\omega\, .0163 \mid}.$$

$$= \frac{R_3}{\omega(.029 + \omega^2 R_3^2\, .000652)}.$$

where QF is the quality factor of the system. To find the maximum, the point where the first derivative of the foregoing expression with respect to $R_3$ equals zero is found, giving:

$$R_3 = \frac{6.67}{\omega}$$

This gives:

$$\frac{I_{3-2}}{V_{3-0}} = \frac{\mid 1.333 + j\, 1.333 \mid}{\left| \left(\frac{6.67}{\omega} - .0217\omega\right) + j\left(.0217\omega - \frac{1.667}{\omega}\right) \right|}$$

$$= \frac{1.885}{\sqrt{\frac{47.22}{\omega^2} - .361 + .000942\omega^2}}.$$

Taking the first derivative of this expression with respect to $\omega$ and setting it equal to zero gives the resonant frequency $\omega_n$ which allows the computation of $R_3$:

$$\omega_n = 15 \text{ rad/sec}$$

$$R_3 = .444 \frac{\text{lb sec}}{\text{in}^5}.$$

The QF of the circuit can be computed from these values and the equation above, yielding:

$$QF = 2.$$

$R_3$ is the difference between the air pressure in accumulators 88 and 90, $\Delta P$, divided by Q. Q in turn can be expressed as $$Q = A \sqrt{2g\frac{\Delta P}{w}}.$$

$$R_3 = \frac{\Delta P}{Q} = \frac{\Delta P}{KA\sqrt{2g\frac{\Delta P}{w}}} = \frac{1}{KA}\sqrt{\frac{\Delta Pw}{2g}}.$$

where K is an orifice coefficient to be determined.

If the motion amplitude of the utilization device is chosen to be 0.01 in, then acceleration in the Z-axis is 2.25 in/sec$^2$ and the resulting differential force is 1.46 lbs. The differential pressure on pistons 38 and 48 required to generate such a differential force is about 0.2 lb/in$^2 \approx \Delta P$. At room temperature and 40 lb/in$^2$, $w = 0.00016$ lb/in$^3$. Now, $$KA = \frac{1}{R}\sqrt{\frac{\Delta Pw}{2g}} = .00046 \text{ in}^2.$$

which yields an orifice diameter. $d_o$ of $$d_o = \frac{.012 \text{ in}}{\sqrt{K}}$$

It is known from fluid mechanics that K will be less than 1. K can be empirically determined by making flow restrictor 92 of various sizes starting with a diameter of 0.012 in, and measuring the damping when utilization device 10 is intentionally displaced. The damping can be measured by monitoring the signal from sensor 52. By testing progressively larger sizes of flow restriction, it was found that a diameter of 0.021 in gave maximum damping, and that therefore K=0.33.

Electronic control circuit 54 includes a compensation amplifier 150, an error amplifier 152 and a power amplifier 154. Sensor 52 supplies the input signal to compensation amplifier 150 and the output of that amplifier, together with the output of potentiometer 132, forms the input to error amplifier 152. The output of error amplifier 152 is supplied to power amplifier 154 which provides the drive signal to motor 126.

From an analysis of the equivalent circuit diagram, it was found that the preferred embodiment would be unstable without the appropriate compensation in electronic control circuitry 54. The motor controlling the valve has one pole at D.C. and also an inertial pole which, in the case of the preferred embodiment, turned out to be at 2.2Hz. The isolator accumulator/controller part of the system adds three additional poles. One pole is due to the accumulator/controller itself and has a frequency that can be expressed as $$\frac{1}{2\pi R(C_1 + C_2)}$$

which in the preferred embodiment turned out to be on the order of a few millihertz, or essentially D.C. The other two poles are due to the combined effects of the accumulator/controller and the isolator supported mass, and the frequency of this double pole can be expressed as $$\frac{1}{2\pi\sqrt{A^2 L (C_1 + C_2)}}$$

In the preferred embodiment, this frequency was found (see above) to be approximately $$\frac{15}{2\pi} \approx 2.4 \text{ Hz}.$$

Thus, the system has a total of 5 poles, two at essentially D.C. and three at about 2 Hz, making the system unstable.

It is desirable to have unity gain cross over frequency for the entire system be low in order to attenuate any high frequency disturbances to the utilization device, and so the cross over frequency for the preferred embodiment was chosen to be 1 Hz. It was discovered that the motor-potentiometer system can be compensated separately from the rest of the system in a manner that essentially eliminates the two poles contributed by the motor from consideration and permitting stabilization of the entire system.

The gain and frequency compensation of error amplifier 152 and power amplifier 154 were chosen to make the bandwidth of the motor potentiometer system approximately 20 times higher than the desired bandwidth of the mass air system comprising the accumulator/controller and the isolator, or approximately 20 Hz. With the two poles caused by the motor significantly higher in frequency than the other poles, their contribution to system instability (or phase margin) is negligible. The motor, potentiometer and control circuitry essentially form a position servo system.

This position servo uses the output of sensor 52, which is amplified and shaped in compensation amplifier 150, as a reference signal. Thus, any change in the separation between support members 22 and 24 results in a change in the reference signal to the position servo circuit and the motor follows this change by appropriately changing the position of valve 108. There is, however, a lag between a change in the separation between support members 22 and 24 and a change in the reference signal due to the compensation in compensation amplifier 150, as is explained in greater detail below.

The equivalent circuit shown in FIG. 12A also shows that accumulator 88 and 90 together with flow restrictor 92 act as a low pass filter to filter out mechanical disturbances to utilization device 10 created by any pressure perturbations emanating from control valves 110 and 112 times the mean piston area of pistons 38 and 48.

It will be understood that the volume of accumulator 90 will depend, in part, on the volume of air spaces 72 and 74. If these air spaces are made larger, then accumulator 90 can be made smaller and vice versa. It will also be understood that, while flow restrictor 92 is desirable and gives improved performance in the preferred embodiment, it is not necessary since some damping is provided by other components of the system such as diaphragms 64 and 68.

Figure 13A:
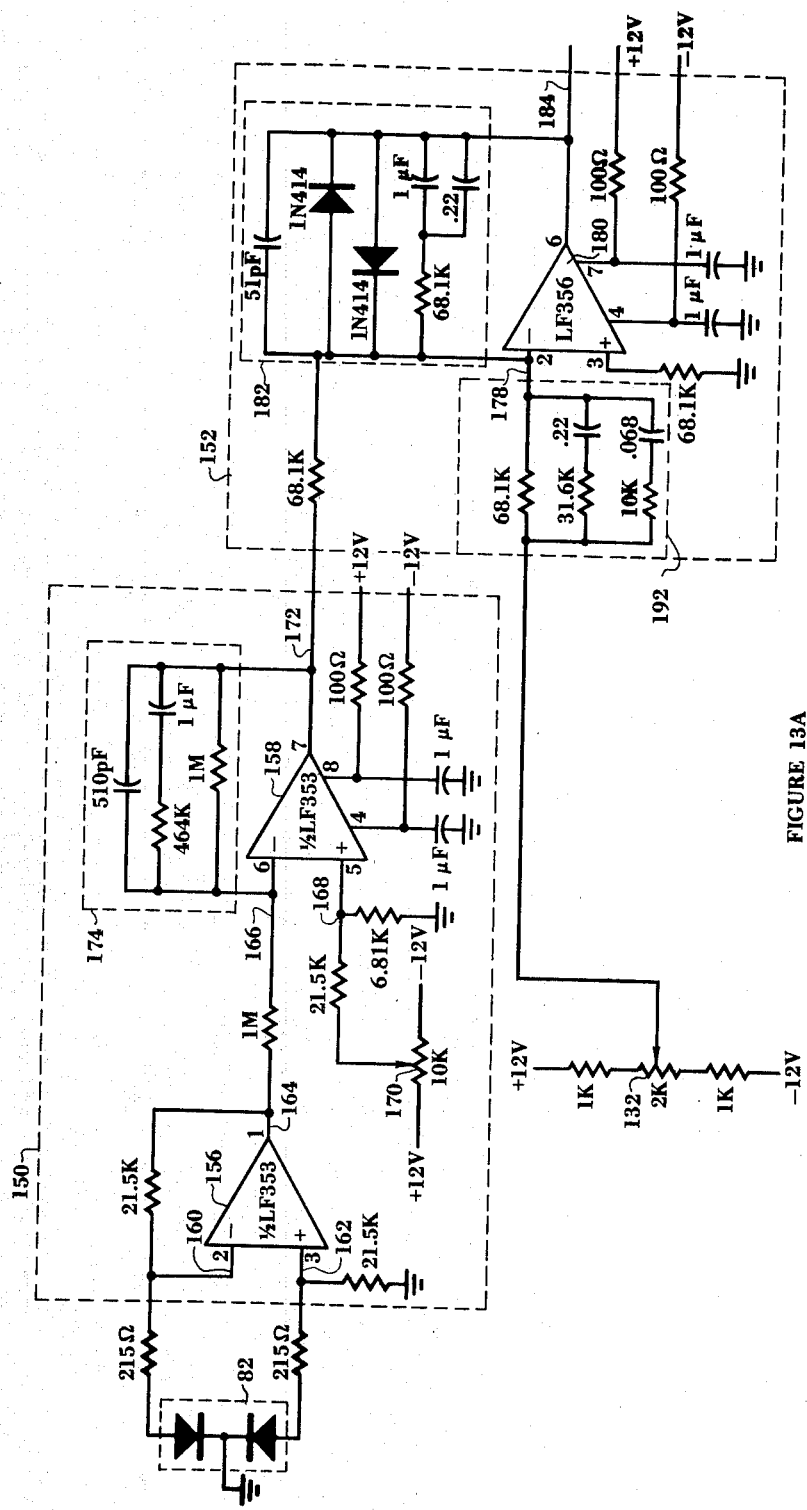
FIGS. 13A and 13B show a schematic circuit diagram of electronic control circuitry.
Figure 13B:
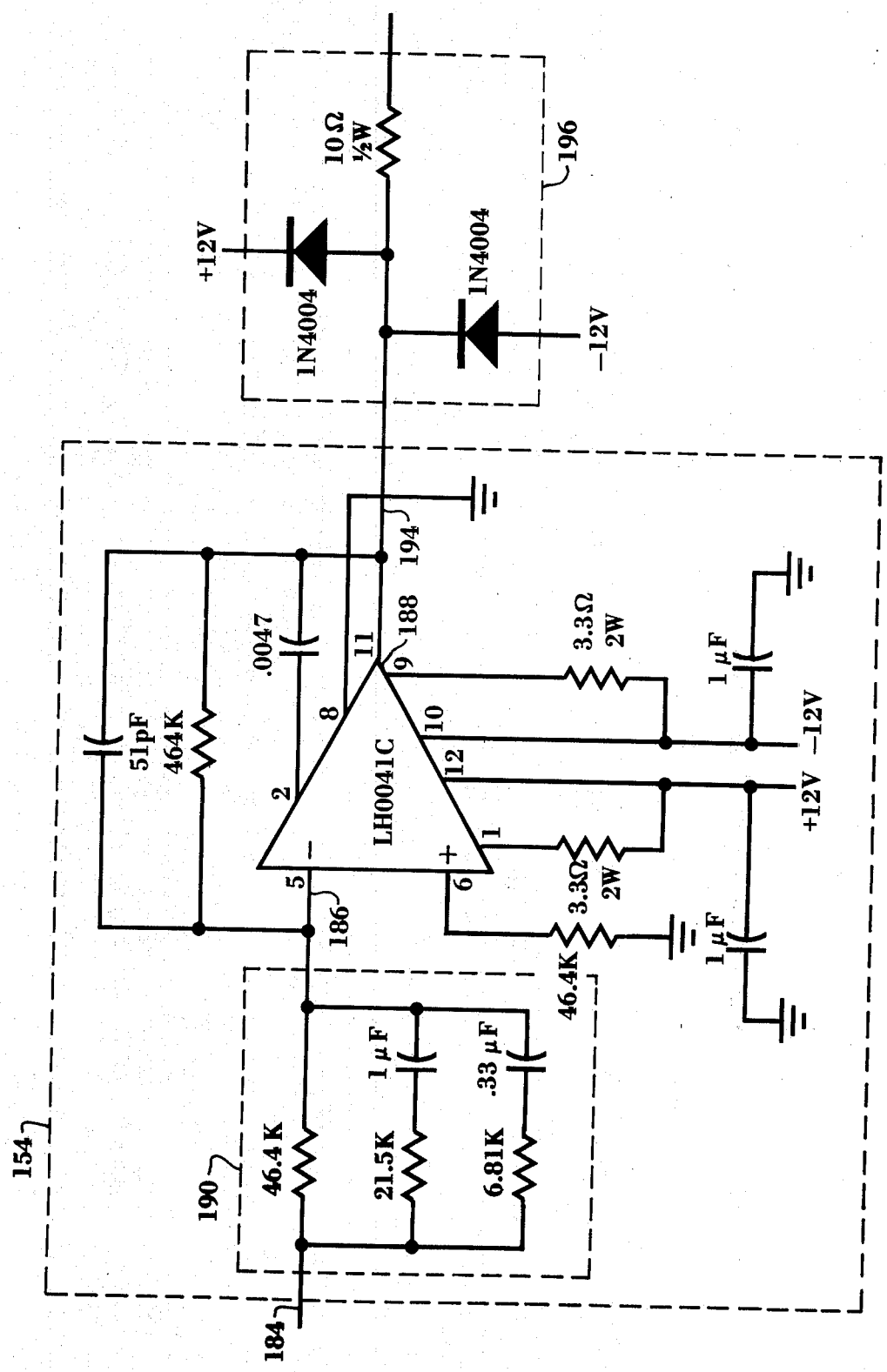

FIGS. 13A and 13B show a detailed schematic diagram of electronic control circuitry 54. Light sensitive detector 82, which is essentially two light sensitive diodes with their cathodes connected together at ground, is connected to the input of compensation amplifier 150. This amplifier comprises differential amplifier stage 156 connected to differential amplifier stage 158. Differential inputs 160 and 162 of differential amplifier stage 156 are connected to the anodes of the diodes in light sensitive detector 82 and a signal proportional to the separation between mounting members 22 and 24 is produced on an output 164 of differential amplifier stage 156.

One differential input 166 of differential amplifier stage 158 is connected to output 164 and another differential input 168 of that stage is connected to a potentiometer 170. Potentiometer 170 is used as a level shifter to compensate for any D.C. offsets from detector 82. Feedback from an output 172 of differential amplifier stage 158 is provided to differential input 166 by a lead-lag network 174. The compensation provided by this feedback lowers the effective gain of the amplifier at the frequency where the double pole occurs. In the case of the preferred embodiment, the lead-lag network causes the gain to roll off between approximately 0.1 Hz and 0.34 Hz.

The signal on output 172 and the voltage on potentiometer 132 are summed equally at an input 178 of an amplifier stage 180 in error amplifier 152. A feedback network 182 is connected between an output 184 of amplifier stage 180 and input 178. This feedback network includes an integrating network to insure that there is sufficient long-term gain to correct any slow, long-term offsets in the relative position of mounting members 22 and 24. Also included in the feedback network is a pair of diodes that act as clamps to prevent amplifier stage 180 from departing from linear operation, saturating and overdriving electric motor 126 in response to large purtubations.

Output 184 is connected to an input 186 of an amplifier stage 188 in power amplifier 154 through a lead network 190. Lead network 190, together with a lead network 192 connected to input 128 act as a pole multiplier to move the inertial pole of the motor potentiometer system by a factor of about 100 in frequency, i.e., to 200 Hz in the case of the preferred embodiment. An output 194 of amplifier stage 188 is connected to electric motor 126 through a protection network 196 that clamps inductively produced electrical spikes from the motor to prevent damage to power amplifier 154.

By moving the inertial pole of the motor up to 200 Hz in frequency, unity gain cross over for the position control feedback loop comprising motor 126, potentiometer 132, error amplifier 152 and power amplifier 154 is at 20 Hz where the gain of the system is falling at less than 12 dB per octave. Thus, the motor potentiometer system is stable since it now responds like a single pole filter with a pole frequency of 20 Hz. The response of the massair system, as discussed above, passes through unity gain at 1 Hz. It also is rolling off at less than 12 dB per octave at gain cross over, because the two poles due to the supported mass and the accumulators occur at a frequency higher than gain cross over by virtue of lead-lag network 174. The pole at 20 Hz has a minimal effect on the stability of the mass air system, subtracting only a few degrees from the phase margin.

The net result of the foregoing compensation scheme is as follows. A system with 5 poles, which normally would be difficult or impossible to stabilize, using ordinary feedback system design techniques, was stabilized first by removing two of the poles from consideration and then working with a three pole system. The two poles were essentially removed from consideration by creating a separate feedback sub-loop for the motor controlling valve 108 and compensating that loop separately from the mass-air system as a whole. This sub-loop was created by connecting potentiometer 132 to motor 126 in a position servo loop. Since the response of the mass-air system is so much slower than the position servo loop, a factor of 20 times in the preferred embodiment, the signal to error amplifier 152 from sensor 52 looks like a slowly varying reference signal.

Once the effects of motor 126 controlling valve 108 are removed from consideration, it becomes possible to compensate the overall system shown in FIG. 12A for stability by choosing $R_3$ for maximum damping and moving the double pole of the mass air system beyond gain cross over as described above.

I claim:

1. A shock and vibration isolation device comprising:
   a frame member;
   a first mounting member coupled to the frame member;
   a second mounting member coupled to the frame member and pendulously supported by the frame member from the first mounting member, thereby allowing movement of the second mounting member with respect to the first mounting member along first and second axes;
   gas actuable displacement means coupled to the frame member and at least one of the first and second mounting members for changing the distance between the first and second mounting members along a third axis;
   sensor means coupled to the first and second mounting members for sensing and producing a signal indicative of the relative separation between the first and second mounting members; and
   gas supply control means including accumulator means coupled to the gas actuable displacement means and to the sensor means for supplying pressurized gas to the gas actuable displacement means to maintain the relative separation between the first and second mounting members constant and to damp relative motion between the first and second mounting members.

2. A shock and vibration isolation system for a utilization device comprising:
   a base;
   a utilization device support member;
   a plurality of isolation devices attaching the utilization device support member to the base, each isolation device comprising:
   a frame member;
   a first mounting member attached to the base and coupled to the frame member;
   a second mounting member attached to the utilization device support member, coupled to the frame member and pendulously supported by the frame member from the first mounting member, thereby allowing movement of the second mounting member with respect to the first mounting member along first and second axes;
   gas actuable displacement means coupled to the frame member and at least one of the first and second mounting members for changing the distance between the first and second mounting members along a third axis;
   sensor means coupled to the first and second mounting members for sensing and producing a signal indicative of the relative separation between the first and second mounting members; and
   gas supply control means including accumulator means coupled to the gas actuable displacement means and to the sensor means for supplying pressurized gas to the gas actuable displacement means to maintain the relative separation between the first and second mounting members constant and to damp relative motion between the first and second mounting members.

3. A shock and vibration isolation device comprising:
   a frame member;
   a first mounting member;
   a first support means supporting the first mounting member on the frame member for permitting variation in the angular position of the first mounting member about a first and a second axis with respect to the frame member and having first gas actuable means for displacing the first mounting member along a third axis with respect to the frame member;
   a second mounting member;
   a second support means supporting the second mounting member on the frame member for permitting variation in the angular position of the second mounting member about a first and a second axis with respect to the frame member and having second gas actuable means for displacing the second mounting member along a third axis with respect to the frame member, the second mounting member being thereby pendulously supported by the frame member from the first mounting member and being moveable with respect to the first mounting member along the first and second axes;
   sensor means connected to the first and second mounting members for sensing and producing a signal indicative of the relative separation between the first and second mounting members; and
   gas supply control means including accumulator means coupled to the first and second gas actuable means and to the sensor means for supplying gas under pressure to the first and second gas actuable means to maintain the relative separation between the first and second mounting members constant and to damp any relative motion between the first and second mounting members.

4. A shock and vibration isolation device as in claim 3 wherein the gas supply control means comprises:
   a gas inlet;
   a gas outlet;
   valve means connected to the gas inlet, the gas outlet and the accumulator means for supplying gas to and exhausting gas from the accumulator means;
   flow restrictor means coupled between the accumulator means and the first and second gas actuable means; and
   control means coupled to the sensor means and the valve means.

5. A shock and vibration isolation system for a utilization device comprising:
   a base;
   a utilization device support member;
   a plurality of isolation devices attaching the utilization device support member to the base, each isolation device comprising:
   a frame member;
   a first mounting member attached to the base;
   a first support means supporting the first mounting member on the frame member for permitting variation in the angular position of the first mounting member about a first and a second axis with respect to the frame member and having first gas actuable means for displacing the first mounting member along a third axis with respect to the frame member;
   a second mounting member attached to the utilization device support member;
   a second support means supporting the second mounting member on the frame member for permitting variation in the angular position of the second mounting member about a first and second axis with respect to the frame member and having second gas actuable means for displacing the second mounting member along a third axis with respect to the frame member, the second mounting member being thereby pendulously supported by the frame member from the first mounting member and being moveable with respect to the first mounting member along the first and second axes;
   sensor means connected to the first and second mounting members for sensing and producing a signal indicative of the relative separation between the first and second mounting members; and
   gas supply control means including accumulator means coupled to the first and second gas actuable means and to the sensor means for supplying gas under pressure to the first and second gas actuable means to maintain the relative separation between the first and second mounting members constant and to damp any relative motion between the first and second mounting members.

6. A shock and vibration isolation device as in claim 1 wherein:
   the first and second mounting members are coupled to the frame member by first and second flexible diaphragms, respectively; and
   the gas actuable displacement means includes a first piston and cylinder formed by the frame member, the first mounting member and the first diaphragm and a second piston and cylinder formed by the frame member, the second mounting member and the second diaphragm.

7. A shock and vibration isolation device as in claim 6 wherein:
   the accumulator means comprises a first accumulator chamber and a second accumulator chamber, the second accumulator chamber being coupled to the first and second pistons and cylinders; and
   the gas supply control means comprises:
   a gas inlet;
   a gas outlet;
   valve means connected to the gas inlet, the gas outlet and the first accumulator chamber for supplying gas to and exhausting gas from the first accumulator chamber;
   flow restrictor means coupling the first accumulator chamber to the second accumulator chamber; and
   control means coupled to the sensor means and the valve means.

8. A shock and vibration isolation device as in claim 7 wherein the valve means comprises:
   a valve body having a gas inlet port coupled to the gas inlet and the first accumulator chamber and a gas outlet port coupled to the gas outlet and the first accumulator chamber;
   a first spring-loaded flap normally biased against the gas inlet port thereby closing the port;

a second spring-loaded flap normally biased against the gas outlet port thereby closing the port;

an eccentric member supported on the valve body and arranged to contact the first and second spring-loaded flaps; and drive means coupled to the eccentric member and the control means for turning the eccentric member and deflecting one of the first and second spring-loaded flaps to open one of the gas inlet port and the gas outlet port to permit gas to flow into or out of the first accumulator chamber.

9. A shock and vibration isolation device as in claim 8 wherein:

the frame member includes a gas passage coupling the first piston and cylinder with the second piston and cylinder;

the first mounting member includes a gas passage coupled to the first piston and cylinder; and the gas supply control means is separate from the gas actuable displacement means and is coupled to the gas passage in the first mounting member by a gas conduit.

10. A shock and vibration isolation system as in claim 2 wherein:

the first and second mounting members are coupled to the frame member by first and second flexible diaphragms, respectively; and the gas actuable displacement means includes a first piston and cylinder formed by the frame member, the first mounting member and the first diaphragm and a second piston and cylinder formed by the frame member, the second mounting member and the second diaphragm.

11. A shock and vibration isolation device as in claim 10 wherein:

the accumulator means comprises a first accumulator chamber and a second accumulator chamber, the second accumulator chamber being coupled to the first and second pistons and cylinders; and the gas supply control means comprises:
a gas inlet;
a gas outlet;
valve means connected to the gas inlet, the gas outlet and the first accumulator chamber for supplying gas to and exhausting gas from the first accumulator chamber;
flow restrictor means coupling the first accumulator chamber to the second accumulator chamber; and
control means coupled to the sensor means and the valve means.

12. A shock and vibration isolation device as in claim 11 wherein the valve means comprises:

a valve body having a gas inlet port coupled to the gas inlet and the first accumulator chamber and a gas outlet port coupled to the gas outlet and the first accumulator chamber;

a first spring-loaded flap normally biased against the gas inlet port thereby closing the port;

a second spring-loaded flap normally biased against the gas outlet port thereby closing the port;

an eccentric member supported on the valve body and arranged to contact the first and second spring-loaded flaps; and drive means coupled to the eccentric member and the control means for turning the eccentric member and deflecting one of the first and second spring-loaded flaps to open one of the gas inlet port and the gas outlet port to permit gas to flow into or out of the first accumulator chamber.

13. A shock and vibration isolation device as in claim 12 wherein:

the frame member includes a gas passage coupling the first piston and cylinder with the second piston and cylinder;

the first mounting member includes a gas passage coupled to the first piston and cylinder; and the gas supply control means is separate from the gas actuable displacement means and is coupled to the gas passage in the first mounting member by a gas conduit.

14. A shock and vibration isolation system as in claim 13 wherein there are three isolation devices attaching the utilization device support member to the base.

15. A shock and vibration isolation device as in claim 3 wherein:

the first support means comprises a first flexible diaphragm attached to the frame member and the first mounting member;

the first gas actuable means includes a first piston and cylinder formed by the frame member, the first mounting member and the first flexible diaphragm;

the second support means comprises a second flexible diaphragm attached to the frame member and the second mounting member; and the second gas actuable means includes a second piston and cylinder formed by the frame member, the second mounting member and the second flexible diaphragm.

16. A shock and vibration isolation device as in claim 15 wherein:

the frame member includes a gas passage coupling the first gas actuable means with the second gas actuable means;

the first mounting member includes a gas passage coupled to the first gas actuable means; and the gas supply control means is separate from the first and second gas actuable means and is coupled to the gas passage in the first mounting member by a gas conduit.

17. A shock and vibration isolation device as in claim 4 wherein:

the accumulator means comprises a first accumulator chamber and a second accumulator chamber, the second accumulator chamber being coupled to the first and second gas actuable means; and the flow restrictor means couples the first accumulator chamber to the second accumulator chamber.

18. A shock and vibration isolation device as in claim 17 wherein the valve means comprises:

a valve body having a gas inlet port coupled to the gas inlet and the first accumulator chamber and a gas outlet port coupled to the gas outlet and the first accumulator chamber;

a first spring-loaded flap normally biased against the gas inlet port thereby closing the port;

a second spring-loaded flap normally biased against the gas outlet port thereby closing the port;

an eccentric member supported on the valve body and arranged to contact the first and second spring-loaded flaps; and drive means coupled to the eccentric member and the control means for turning the eccentric member and deflecting one of the first and second spring-loaded flaps to open one of the gas inlet port and the gas outlet port to permit gas to flow into or out of the first accumulator chamber.

19. A shock and vibration isolation system as in claim 5 wherein:
the first support means comprises a first flexible diaphragm attached to the frame member and the first mounting member;
the first gas actuable means includes a first piston and cylinder formed by the frame member, the first mounting member and the first flexible diaphragm;
the second support means comprises a second flexible diaphragm attached to the frame member and the second mounting member; and
the second gas actuable means includes a second piston and cylinder formed by the frame member, the second mounting member and the second flexible diaphragm.

20. A shock and vibration isolation system as in claim 19 wherein:
the frame member includes a gas passage coupling the first gas actuable means with the second gas actuable means;
the first mounting member includes a gas passage coupled to the first gas actuable means; and
the gas supply control means is separate from the first and second gas actuable means and is coupled to the gas passage in the first mounting member by a gas conduit.

21. A shock and vibration isolation system as in claim 5 wherein the gas supply control means comprises:
a gas inlet;
a gas outlet;
valve means connected to the gas inlet; the gas outlet and the accumulator means for supplying gas to and exhausting gas from the accumulator means;
flow restrictor means coupled between the accumulator means and the first and second gas actuable means; and
control means coupled to the sensor means and the valve means.

22. A shock and vibration isolation system as in claim 21 wherein:
the accumulator means comprises a first accumulator chamber and a second accumulator chamber, the second accumulator chamber being coupled to the first and second gas actuable means; and
the flow restrictor means couples the first accumulator chamber to the second accumulator chamber.

23. A shock and vibration isolation system as in claim 22 wherein the valve means comprises:
a valve body having a gas inlet port coupled to the gas inlet and the first accumulator chamber and a gas outlet port coupled to the gas outlet and the first accumulator chamber;
a first spring-loaded flap normally biased against the gas inlet port thereby closing the port;
a second spring-loaded flap normally biased against the gas outlet port thereby closing the port;
an eccentric member supported on the valve body and arranged to contact the first and second spring-loaded flaps; and
drive means coupled to the eccentric member and the control means for turning the eccentric member and deflecting one of the first and second spring-loaded flaps to open one of the gas inlet port and the gas outlet port to permit gas to flow into or out of the first accumulator chamber.

24. A shock and vibration isolation system as in claim 23 wherein there are three isolation devices attaching the utilization device support member to the base.

* * * * *